United States Patent
Chen et al.

(10) Patent No.: US 9,269,812 B2
(45) Date of Patent: Feb. 23, 2016

(54) SEMICONDUCTOR DEVICE HAVING V-SHAPED REGION

(71) Applicant: Taiwan Semiconductor Manufacturing Company Limited, Hsin-Chu (TW)

(72) Inventors: Chao-Hsuing Chen, Tainan (TW); Ling-Sung Wang, Tainan (TW); Chi-Yen Lin, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/600,095

(22) Filed: Jan. 20, 2015

(65) Prior Publication Data

US 2015/0137182 A1 May 21, 2015

Related U.S. Application Data

(62) Division of application No. 13/726,270, filed on Dec. 24, 2012, now Pat. No. 8,940,594.

(51) Int. Cl.

| | |
|---|---|
| *H01L 29/78* | (2006.01) |
| *H01L 21/36* | (2006.01) |
| *H01L 21/8238* | (2006.01) |
| *H01L 29/66* | (2006.01) |
| *H01L 29/06* | (2006.01) |
| *H01L 29/165* | (2006.01) |
| *H01L 27/092* | (2006.01) |
| *H01L 29/10* | (2006.01) |
| *H01L 29/161* | (2006.01) |

(52) U.S. Cl.
CPC ............ *H01L 29/7848* (2013.01); *H01L 21/36* (2013.01); *H01L 21/823807* (2013.01); *H01L 21/823814* (2013.01); *H01L 27/0928* (2013.01); *H01L 29/06* (2013.01); *H01L 29/1058* (2013.01); *H01L 29/1079* (2013.01); *H01L 29/161* (2013.01); *H01L 29/165* (2013.01); *H01L 29/66636* (2013.01); *H01L 29/78* (2013.01)

(58) Field of Classification Search
USPC .......................................................... 257/369
See application file for complete search history.

(56) References Cited

U.S. PATENT DOCUMENTS

| | | | |
|---|---|---|---|
| 2004/0004251 A1* | 1/2004 | Madurawe | H01L 27/0688 257/347 |
| 2007/0105331 A1 | 5/2007 | Murthy et al. | |
| 2011/0183486 A1 | 7/2011 | Chan et al. | |
| 2012/0037998 A1* | 2/2012 | Bedell | H01L 21/823807 257/369 |
| 2012/0126331 A1 | 5/2012 | Lin et al. | |
| 2014/0264607 A1* | 9/2014 | Basu | H01L 29/66795 257/365 |

OTHER PUBLICATIONS

Corresponding Chinese application, Chinese Office action dated Dec. 28, 2015, 9 pages.

* cited by examiner

*Primary Examiner* — Thao P Le
(74) *Attorney, Agent, or Firm* — Cooper Legal Group, LLC

(57) ABSTRACT

Among other things, a semiconductor device or transistor and a method for forming the semiconductor device are provided for herein. The semiconductor device comprises one or more v-shaped recesses in which stressed monocrystalline semiconductor material, such as silicon germanium, is grown, to form at least one of a source or a drain of the semiconductor device. The one or more v-shaped recesses are etched into a substrate in-situ. The semiconductor device comprises at least one of a source or a drain having a height-to-length ratio exceeding at least 1.6 when poly spacing between a first part of the semiconductor device (e.g., first transistor) and a second part of the semiconductor device (e.g., second transistor) is less than about 60 nm.

20 Claims, 5 Drawing Sheets

SEMICONDUCTOR DEVICE HAVING V-SHAPED REGION

RELATED APPLICATIONS

This application is a divisional of and claims priority to U.S. patent application Ser. No. 13/726,270, titled SEMICONDUCTOR DEVICE HAVING V-SHAPED REGION" and filed on Dec. 24, 2012, which is incorporated herein by reference.

BACKGROUND

As consumers continue to demand thinner, lighter, and smaller electronic devices (e.g., televisions, personal computers, tablets, cellular telephones, etc.), the premium placed on real-estate within such devices has grown. Accordingly, semiconductor manufacturers are pressed to create smaller and faster semiconductor circuits that also consume less power (e.g., to improve energy efficiency and/or reduce battery consumption). One type of circuit design that has grown in popularity due to this demand for smaller, faster, and/or more energy efficient circuitry is circuitry that comprises complementary-metal-oxide-semiconductors (CMOSs). Such circuitry often uses a combination of p-type and n-type metal-oxide-semiconductor field effect transistors (MOSFETs) to implement logic gates and other circuit functionality.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more semiconductor devices and methods for forming such semiconductor devices are provided for herein. In an embodiment, a semi-conductor device is formed having one or more v-shaped recesses etched into a substrate upon which the semiconductor device is formed. At least a portion of the recess is filled with a monocrystalline semiconductor material, such as silicon germanium, which is compressed by the v-shaped recess (e.g., causing the monocrystalline semiconductor material to be stressed). By way of example, in an embodiment, the semiconductor device comprises a p-type metal-oxide-semiconductor field effect transistor (PFET). The PFET comprises a substrate having two recesses, with a first recess located diametrically opposite a second recess relative to a gate stack of the PFET, which is formed on a top surface of the substrate. The first recess and the second recess are respectively v-shaped and filled with a stressed monocrystalline semiconductor material. The stressed monocrystalline semiconductor material within the first v-shaped recess forms a source of the PFET and the stressed monocrystalline semiconductor material within the second v-shaped recess forms a drain of the PFET, for example.

The v-shaped recess of the semiconductor is etched into a region of the substrate in-situ. For example, in an embodiment, the substrate is exposed to an etching gas in-situ to etch the v-shaped recess(es) into the lattice structure of the substrate. In an embodiment, the etching gas comprises hydrogen chloride (HCl). In another embodiment, the etching gas comprises HCl heated to a temperature of between about 400 degrees Celsius to about 1000 degree Celsius. After the v-shaped recess(es) is etched into the region of the substrate, stressed monocrystalline semiconductor material (e.g., silicon germanium) is epitaxially grown within the v-shaped recess(es), for example. In an embodiment, etching the v-shaped recess(es) in-situ facilitates forming a semiconductor device having a larger height-to-length ratio at a given poly-to-poly spacing relative to a semiconductor device having a v-shaped recess etched ex-situ.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features is arbitrarily increased and/or reduced for clarity of discussion.

DETAILED DESCRIPTION

Figure 1:
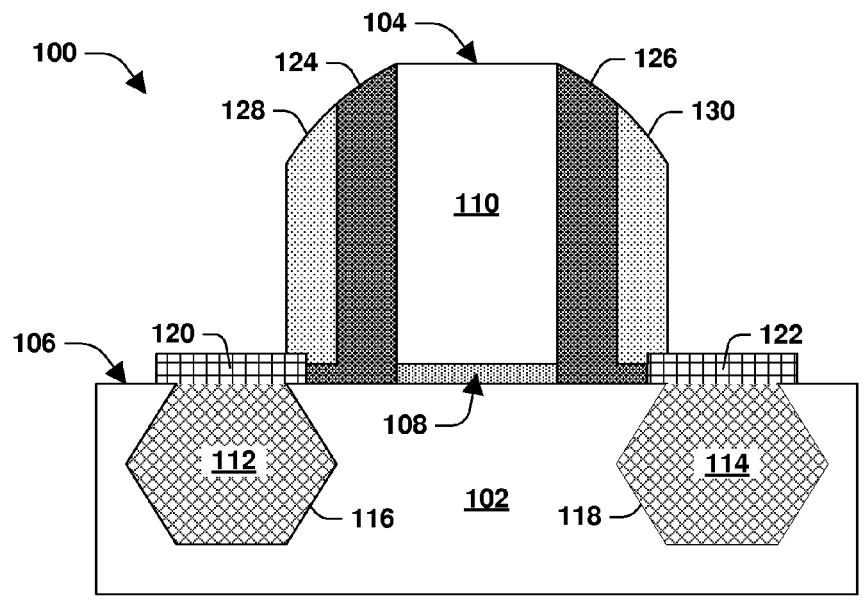
FIG. 1 illustrates a cross-sectional view of an example semiconductor device according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It is to be appreciated that as used herein, in-situ is generally intended to refer to a process that occurs within a chamber in which semiconductor material is epitaxially grown. In comparison, ex-situ is generally intended to refer to a process that occurs outside of the chamber where the semiconductor material is grown.

Moreover, the term material is used herein in a broad sense to refer to a single chemical element or a composition of elements. For example, a semiconductor material is comprised of a single element, such as silicon, or is comprised of a composition of elements, such as silicon germanium, for example.

While specific reference is made herein to a p-type metal-oxide-semiconductor field effect transistor (p-type MOSFET), it is to be appreciated that the techniques and/or features described herein also find applicability to n-type MOSFETs. Further, p-type MOSFETs is at times abbreviated herein as p-type field effect transistors or PFETs and n-type MOSFETs is at times abbreviated herein as n-type field effect transistors or NFETs.

Referring to FIG. 1, a cross-sectional view of an example semiconductor device 100 as provided for herein is illustrated. In an embodiment, the semiconductor device 100 is a transistor, such as a PFET, for example. It is to be appreciated that the following arrangement is merely an example arrangement and it not intended to limit the scope of the disclosure, including the scope of the claims. Moreover, at least some aspects of the semiconductor device 100 are not drawn to scale.

The semiconductor device 100 comprises a substrate 102, or rather is formed upon the substrate, and a gate stack 104, which is formed on a first substrate surface 106 of the substrate 102. In an embodiment, the substrate 102 is a silicon substrate (e.g., wafer) having a crystalline lattice structure. Other example materials for the substrate 102 include, among other things, germanium and diamond, silicon carbide, gallium arsenide, indium arsenide, indium phosphide, and/or other elementary or compound semiconductor materials. In an embodiment, the substrate 102 has a bulk substrate structure. In another embodiment, the substrate 102 comprises a silicon-on-insulator (SOI) structure or other structure. In still another embodiment, the substrate 102 comprises an epitaxial layer (epi layer), for example.

In the example embodiment, the gate stack 104 comprises a gate dielectric layer 108 which adjoins the first substrate surface 106 of the substrate 102 and a gate electrode 110. The gate dielectric layer 108 is comprised of silicon oxide, silicon nitride, silicon oxynitride, and/or other suitable materials. In an embodiment, the gate dielectric layer 108 is comprised of a high-k gate dielectric, such as metal oxides, metal nitrides, metal silicates, transition metal-oxides, transition metal-nitrides, transition metal-silicates, oxynitrides of metals, metal aluminates, zirconium silicate, zirconium aluminate, combinations thereof, or other suitable material, for example. Examples of high-k gate dielectrics include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, (Ba,Sr)$TiO_3$ (BST), $Al_2O_3$, $Si_3N_4$, or combinations thereof.

The gate electrode 110 comprises one or more layers, which include interface layers, capping layers, and/or sacrificial layers (e.g., dummy gates), for example. By way of example, in an embodiment, the gate electrode 110 comprises a polysilicon layer (e.g., comprising a p-type dopant such as boron) and a lower-resistance layer (e.g., relative to the polysilicon layer). In an example, the lower-resistance layer is comprised of a metal. In another example, the lower-resistance layer is comprised of a silicide comprising metal (e.g., such as a silicide of cobalt (CoSi)). In still other embodiments, the gate electrode 110 is single layer comprised of polysilicon, Ti, TiN, TaN, Ta, TaC, TaSiN, W, WN, MoN, MoON, $RuO_2$, and/or other suitable materials, for example. Example techniques for forming such layers include physical vapor deposition (PVD), chemical vapor deposition (CVD), atomic layer deposition (ALD), and/or plating, for example.

The semiconductor device 100 also comprises a source 112 and a drain 114 formed in the substrate 102 or rather in v-shaped recesses 116, 118 respectively etched into the substrate 102. Typically, the source 112 is disposed on a first side of the gate stack 104 and the drain 114 is disposed on a diametrically opposite side of the gate stack 104. The v-shaped recesses 116, 118 respectively extend into the substrate 102 from the first substrate surface 106 upon which the gate stack 104 of the semiconductor device 100 is formed. As will be described in more detail below, such v-shaped recesses 116, 118 are etched into the substrate 102 in-situ.

The source 112 is at least partially formed by a first monocrystalline semiconductor material and the drain 114 is at least partially formed by a second monocrystalline semiconductor material. In an embodiment, the first monocrystalline semiconductor material and the second monocrystalline semiconductor material are a same material. In another embodiment, the first monocrystalline semiconductor material is a different material than the second monocrystalline semiconductor material. In an embodiment, at least one of the first monocrystalline semiconductor material or the second monocrystalline semiconductor material comprises an alloy of silicon combined with another semiconductor material. For example, in an embodiment, the first and second monocrystalline semiconductor materials comprise silicon germanium grown epitaxially. In some embodiments, dopants are added to at least one of the first monocrystalline semiconductor material or the second monocrystalline semiconductor material to affect electrical properties of the source 112 and/or the drain 114. A degree of doping (if any) is a function of the desired application for the semiconductor device 100, for example.

In an embodiment, as part of epitaxially growing the first monocrystalline semiconductor material, a first capping layer 120 is formed at the source 112 spatially proximate the first substrate surface 106. In an example, the capping layer 120 comprises a different material than the first monocrystalline semiconductor material. For example, the capping layer 120 comprises a larger concentration of silicon than the first monocrystalline semiconductor material. In another embodiment, a second capping layer 122 is formed at the drain 114 spatially proximate the first substrate surface 106. In an example, the second capping layer 122 comprises a same material composition as the first capping layer 120. In an example, the second capping layer 122 comprises a different material composition than the first capping layer 120.

The semiconductor device 100 further comprises a first gate spacer 124 disposed adjacent a first sidewall of the gate stack 104 and a second gate spacer 126 disposed adjacent a second sidewall of the gate stack 104. In an embodiment, the first gate spacer 124 facilitates defining a portion of the source 112 (e.g., to etch a u-shaped recess and/or the v-shaped recess 116 away from the gate stack 104) and the second gate spacer 126 facilitates defining a portion of the drain 114 (e.g., to etch a u-shaped recess and/or the v-shaped recess 118 away from the gate stack 104). In another embodiment, at least one of the first gate spacer 124 or the second gate spacer 126 facilitate lateral electric distance control, for example.

In an embodiment, the first gate spacer 124 and the second gate spacer 126 comprise a substantially same composition. In another embodiment, the first gate spacer 124 comprises a different composition than the second gate spacer 126. Example materials for the first gate spacer 124 and/or the second gate spacer 126 include silicon nitride, silicon oxide, silicon carbide, silicon oxynitride, other dielectric materials, and/or combinations thereof, for example.

The semiconductor device 100 also comprises a first spacer element 128 adjacent the first gate spacer 124 and a second spacer element 130 adjacent the second gate spacer 126. In an embodiment, a height of the first spacer element 128 (e.g., as measured from the first substrate surface 106 and extending vertically on the page) is less than a height of the first gate spacer 124 (e.g., which has a peak height that is equal to or greater than a height of the gate stack 104). In another embodiment, a height of the second spacer element 130 (e.g., as measured from the first substrate surface 106 and extending vertically on the page) is less than a height of the second gate spacer 126 (e.g., which has a peak height that is equal to or greater than a height of the gate stack 104). Example materials for the first gate spacer 128 and/or the second gate spacer 130 include silicon nitride, silicon oxide, silicon carbide, silicon oxynitride, other dielectric materials, and/or combinations thereof, for example.

An example method for fabricating the semiconductor device 100, such as a PFET or other transistor, is described with reference to FIGS. 2-6.

Figure 2:
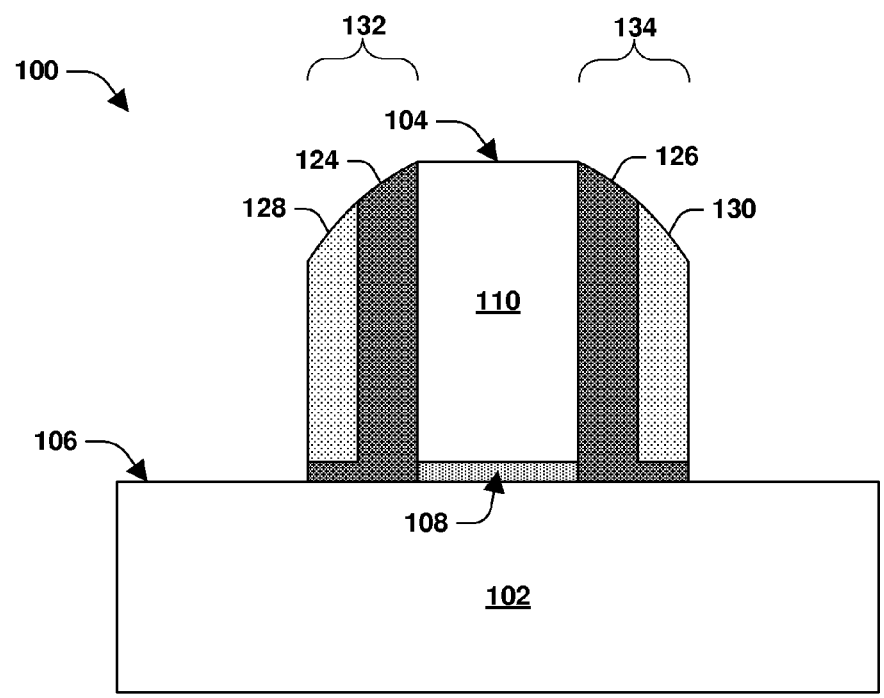
FIG. 2 illustrates a cross-sectional view of an example semiconductor device according to some embodiments at a stage in a fabrication process.

Referring to FIG. 2, a gate stack 104 of the semiconductor device 100 is formed. The gate stack 104 overlays a substrate 102 of the semiconductor device 100 and adjoins a first substrate surface 106 of the substrate 102. Typically, the substrate 102 has a crystalline lattice structure and is comprised of a single element or a composition of elements. For example, in an embodiment, the substrate 102 comprises merely silicon. In another embodiment, the substrate 102 is comprised of a composition comprising silicon.

The gate stack 104 comprises a gate dielectric layer 108 and a gate electrode 110. As illustrated, the gate dielectric layer 108 is formed adjacent the substrate 102 (e.g., and adjoins the first substrate surface 106). In the illustrated embodiment, the gate dielectric layer 108 spatially separates the gate electrode 110 from the substrate 102 (e.g., such that the gate dielectric layer 108 is sandwiched between the substrate 102 and the gate electrode 110). In an embodiment, the gate electrode 110 is doped with a dopant to a desired concentration (e.g., as a function of an application for the semiconductor device 100 and/or as a function of design characteristics for the semiconductor device 100).

In the illustrated embodiment, sidewall spacers 132, 134 are formed on opposite sidewalls of the gate stack 104. A first sidewall spacer 132 is comprised of the first gate spacer 124 and the first spacer element 128 and a second sidewall spacer 134 is comprised of the second gate spacer 126 and the second spacer element 130. In an embodiment, the first gate spacer 124 and the second gate spacer 126 respectively comprise a nitride composition, such as silicon nitride, for example, although compositions not comprising a nitride are also contemplated. In another embodiment, the first spacer element 128 and the second spacer element 130 respectively comprise an oxide composition, such as silicon oxide, for example, although compositions not comprising an oxide are also contemplated.

In an embodiment, an insulting cap (not shown) is formed on a top surface of the gate stack 104, opposite a surface of the gate stack 104 neighboring the gate dielectric layer 108. For example, in an oxide hard mask can be formed on the top surface of the gate stack 104. In an embodiment, such an insulting cap is removed during the manufacturing process to facilitate applying a bias directly to the gate electrode 110.

Figure 3:
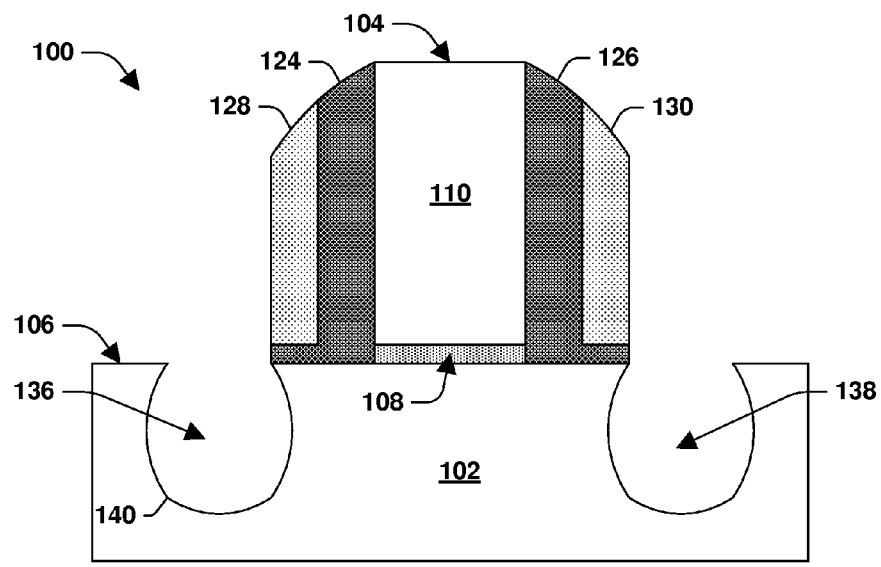
FIG. 3 illustrates a cross-sectional view of an example semiconductor device according to some embodiments at a stage in a fabrication process.

After the gate stack 104 is formed, u-shaped recess are formed in the substrate 102. FIG. 3 illustrates the semiconductor device 100 after a first u-shaped recess 136 has been etched into a first region of the substrate 102 and a second u-shaped recess 138 has been etched into a second region of the substrate 102. As illustrated, the first u-shaped recess 136 is typically etched on a diametrically opposite side of the gate stack 104 relative to where the second u-shaped recess 138 is etched. Both the first u-shaped recess 136 and the second u-shaped recess 138 extend into the substrate 102.

The first u-shaped recess 136 and the second u-shaped recess 138 are referred to as u-shaped due to the substantially continuous nature of a sidewall that defines respective recesses. For example, a first sidewall 140 of the substrate 102 that at least partially defines the first u-shaped recess 136 is substantially continuous in form (e.g., such that the sidewall 140 has few, if any, corners). In an embodiment, the first u-shaped recess 136 and the second u-shaped recess 138 are substantially matching in shape and/or volume. In another embodiment, the first u-shaped recess 136 is shaped differently than the second u-shaped recess 138 and/or the first u-shaped recess 136 has a different volume than the second v-shaped recess 138.

The first u-shaped recess 136 and the second u-shaped recess 138 are etched via a dry etching and/or a wet etching technique. For example, in an embodiment, the first u-shaped recess 136 and the second u-shaped recess 138 are etched via dry etching techniques. In another example, the first u-shaped recess 136 and the second u-shaped recess 138 are etched via a dry etching technique using an etching component that is at least partially isotropic in character. In yet another embodiment, the first u-shaped recess 136 and the second u-shaped recess 138 are etched via reactive-ion etching. In an example, the first u-shaped recess 136 is etched using a same technique that is used to etch the second u-shaped recess 138. In another example, the first u-shaped recess 136 is etched using a different technique than the technique used to etch the second u-shaped recess 138.

Figure 4:
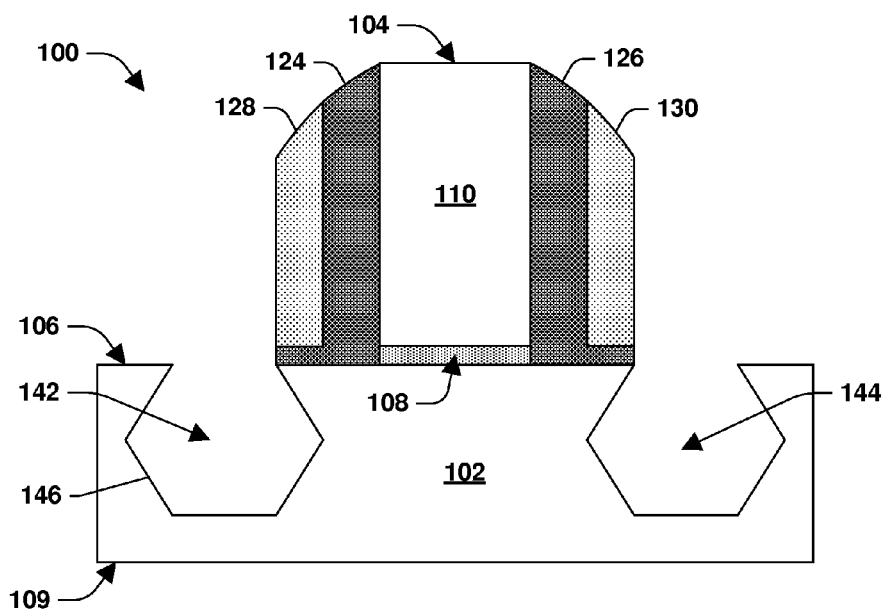
FIG. 4 illustrates a cross-sectional view of an example semiconductor device according to some embodiments at a stage in a fabrication process.

V-shaped recesses are formed at least partially within at least one of the first u-shaped recess or the second u-shaped recess 138. FIG. 4 illustrates the semiconductor device 100 after a first v-shaped recess 142 has been at least partially etched in a region of the semiconductor in which the first u-shaped recess 136 was etched and after a second v-shaped recess 144 has been at least partially etched in a region of the semiconductor in which the second u-shaped recess 138 was etched. Accordingly, the first v-shaped recess 142 replaces the first u-shaped recess 136 and the second v-shaped recess replaces the second u-shaped recess 138.

It is to be appreciated that the v-shaped recesses is not shaped to form a traditional "V" shape. Rather, the phrase v-shaped recess is used herein in a broad sense to refer to a recess that has at least one, such as a first sidewall 146, extending in a downward direction (e.g., from the first substrate surface 106 toward a second substrate surface 109 on an opposite side of the substrate 102 relative to the first substrate surface 106) and angled at an angle other than normal relative to a plane in which the first substrate surface 106 lays. That is, for example, the substrate 102 is etched to form one or more v-shaped recess 142, 144 respective defined by at least one sidewall that is oriented at an angle other than normal relative to the first substrate surface 106. For example, in the illustrated embodiment, the substrate 102 is etched to form a substantially hexagonal shaped recess 142. In another embodiment, at least one of the v-shaped recesses 142, 144 are substantially trapezoidal. In still other embodiments, at least one of the v-shaped recesses 142, 144 forms other shapes. For example, in other embodiment, at least one of the v-shaped recesses 142, 144 form a diamond shape.

In an embodiment, the first v-shaped recess 142 and the second v-shaped recess 144 are substantially matching in shape and/or volume. In another embodiment, the first v-shaped recess 142 is shaped differently than the second v-shaped recess 144. In still another embodiment, the first v-shaped recess 142 has a different volume than the second v-shaped recess 144. A distance that the first v-shaped recess 142 and/or a distance that the second v-shaped recess 144 extends into the substrate from the first substrate surface 106 is a function of the intended application of the semiconductor device 100, for example. In an embodiment, the first v-shaped recess 142 and the second v-shaped recess 144 extend about 20 nm into the substrate 102. In other embodiments, the first v-shaped recess 142 and/or the second v-shaped recess 144 extend more than or less than 20 nm into the substrate 102.

The first v-shaped recess 142 and the second v-shaped recess 144 are etched into the substrate 102 in-situ. That is, the etching of the first v-shaped recess 142 and the second v-shaped recess 144 occurs in a chamber where monocrystalline semiconductor material is grown. In an embodiment, etching the substrate 102 to form the v-shaped recesses 142, 144 comprises etching the substrate 102 (or a region of the substrate 102 spatially proximate the u-shaped recesses 136, 138) via a chemical vapor deposition (CVD) configured to apply an etching gas to at least a portion of the substrate 102 where the etching is to occur. For example, in an embodiment, a CVD tool applies the etching gas to a portion of the substrate 102 spatially proximate at least one of the first u-shaped recess 136 or the second u-shaped recess 138. In an example, the etching gas comprises hydrogen chloride (HCl) or other suitable gaseous materials. In some embodiments, one or more v-shaped recesses are etched via an etchant, such as an etching liquid or etching gas, configured to etch the silicon or other material of the substrate 102. The etching gas is configured to interact with the lattice structure of the substrate 102 to break down at least a portion of the lattice structure and form the v-shaped recesses 142, 144.

In some embodiments, the etching gas is heated to a desired temperature that causes the etching gas to interact with a lattice structure of the substrate 102 to form the v-shaped recesses 142, 144. By way of example, in an embodiment, the etching gas is heated to a temperature of between about 400 degrees Celsius to about 1000 degrees Celsius. In another embodiment, the etching gas comprises hydrogen chloride and is heated to a temperature of about 780 degrees Celsius.

In an embodiment, prior to etching the substrate 102 to form the v-shaped recesses 142, 144, native oxide is removed. By way of example, native oxide develops within the first u-shaped recess 136 and/or within the second u-shaped recess 138 due to interaction of the substrate 102 with air. Accordingly, in an embodiment, prior to etching the v-shaped recesses 142, 144, such as by utilizing an etching gas, at least some of the native oxide that has developed on the substrate 102, or within one or more of the u-shaped recesses 136, 138 is removed. In an embodiment, the native oxide is removed via a low-pressure oxidation process or other suitable oxide removal process. In an example, the native oxide is removed in-situ.

Figure 5:
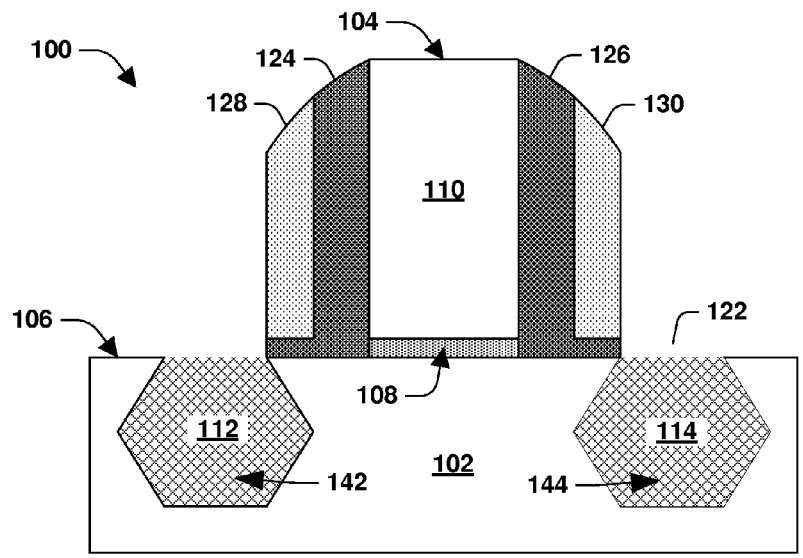
FIG. 5 illustrates a cross-sectional view of an example semiconductor device according to some embodiments at a stage in a fabrication process.

After the v-shaped recesses 142, 144 are etched into the substrate in-situ, stressed monocrystalline semiconductor material is epitaxially grown from one or more exposed surfaces within the respective v-shaped recesses 142, 144. For example, as illustrated in FIG. 5, a first region of silicon germanium is epitaxially grown from one or more exposed interior surfaces of the first v-shaped recess 142 and a second region of silicon germanium is epitaxially grown from one or more exposed interior surfaces of the second v-shaped recess 144. In an embodiment, one or more of the epitaxial regions within the v-shaped recesses are substantially flush with the first substrate surface 106. In another embodiment, one or more of the epitaxial regions extends above the first substrate surface 106 to provide a raised epitaxial region(s). In another embodiment, one or more of the epitaxial regions dips below the first substrate surface 106 to provide for a depressed epitaxial region(s).

The source 112 of the semiconductor device 100 is at least partially formed from the first region of silicon germanium that at least partially fills the first v-shaped recess 142. The drain 114 of the semiconductor device 100 is at least partially formed from the second region of silicon germanium that at least partially fills the second v-shaped recess 144.

Figure 6:
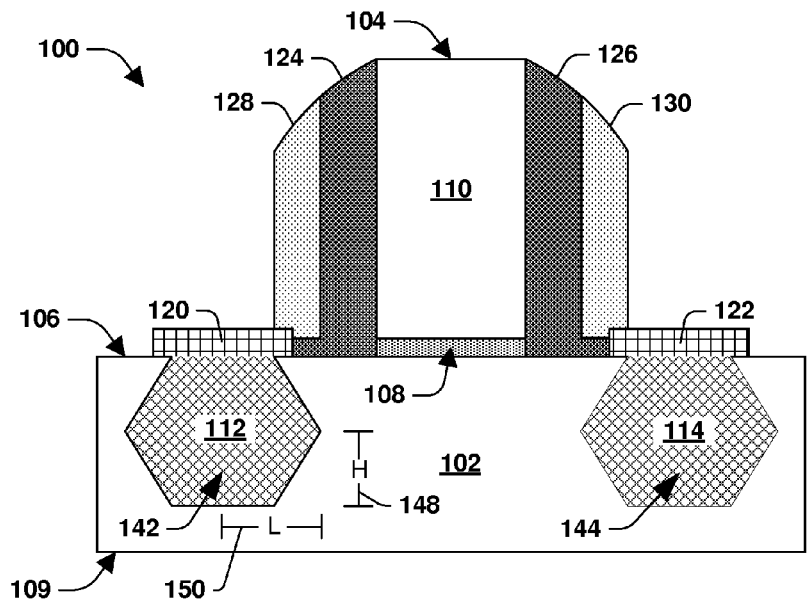
FIG. 6 illustrates a cross-sectional view of an example semiconductor device according to some embodiments at a stage in a fabrication process.

In an embodiment, as illustrated in FIG. 6, a first capping layer 120 is formed as part of epitaxially growing the stressed monocrystalline semiconductor material in the first v-shaped recess 142 and a second capping layer 122 is formed as part of epitaxially growing the stressed monocrystalline semiconductor material in the second v-shaped recess 144. In an embodiment, the first capping layer 120 comprises a different material composition than the stressed monocrystalline semiconductor material in the first v-shaped recess 142. In another embodiment, the second capping layer 122 comprises a different material composition than the stressed monocrystalline semiconductor material in the second v-shaped recess 144. For example, in an embodiment, the first capping layer 120 comprises a higher concentration of silicon relative to the stressed monocrystalline semiconductor material in the first v-shaped recess 142 and the second capping layer 122 comprises a higher concentration of silicon relative to the stressed monocrystalline semiconductor material in the second v-shaped recess 144.

In an embodiment, where a dielectric cap is placed on top of the gate stack 104, the dielectric is removed after the stressed monocrystalline semiconductor material is epitaxially grown. Moreover, after the stressed monocrystalline semiconductor material is epitaxially grown (and the dielectric cap is removed), an implantation process is performed to form/define the source 112 at least partially within the stressed monocrystalline semiconductor material in the first v-shaped recess 142 and to form/define the drain 114 at least partially within the stressed monocrystalline semiconductor material in the second v-shaped recess 144.

A height of the source 112 is generally defined as one-half a depth of the first v-shaped recess 142, as measured from the first substrate surface 106 toward the second substrate surface 109. A length of the source 112 is generally defined as one-half of the width of the first v-shaped recess 142 as measured in a direction perpendicular to the depth (e.g., left-to-right on the page). For example, in the illustrated embodiment, a height of the source 112 is defined by "H" 148 and a length of the source 112 is defined by "L" 150. A height of the drain 114 is likewise generally defined as one-half a depth of the second v-shaped recess 144, as measured from the first substrate surface 106 toward the second substrate surface 109, and a length of the drain 114 is generally defined as one-half of the width of the second v-shaped recess 144 as measured in a direction perpendicular to the depth (e.g., left-to-right on the page).

Figure 7:
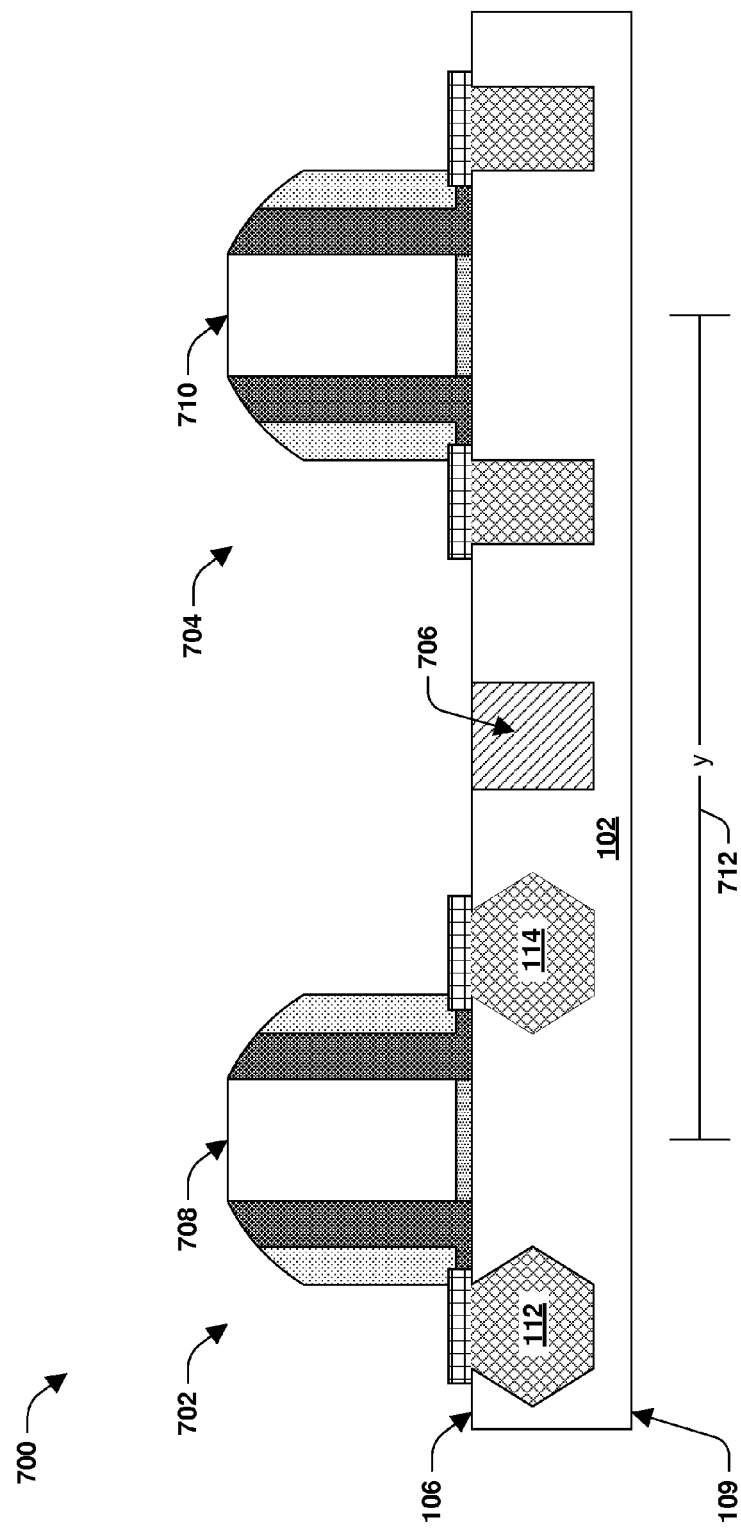
FIG. 7 illustrates an example configuration of a circuit according to some embodiments.

FIG. 7 illustrates an example configuration of a circuit 700, such as a complementary-metal-oxide-semiconductor (CMOS) circuit comprising a first transistor 702 and a second transistor 704. In an embodiment, the first transistor is a PFET (e.g., 100 in FIG. 1) and the second transistor 704 is an NFET. In other embodiments, the first transistor 702 and the second transistor 702 are both PFETs or both NFETs.

In the example embodiment, the first transistor 702 is electrically isolated from the second transistor 704 via an isolation element 706 configured to mitigate electrical current leakage between the first transistor 702 and the second transistor 704. In the illustrated embodiment, the isolation element 706 extends downward through a portion of the substrate 102. In another embodiment, the isolation layer 706 extends downward from a first substrate surface 106 to the second substrate surface 109.

In another embodiment, there is no isolation element 706. Moreover, in some embodiments, the drain of the first transistor 702 is a source (or drain) of the second transistor 704. For example, in an embodiment, a first PFET transistor neighbors a second PFET transistor, and the second PFET transistor shares the stressed monocrystalline semiconductor material comprised in at least one v-shaped recess of the first PFET transistor.

A distance between the first transistor 702 and the second transistor 704 is referred to herein as a poly spacing and is generally measured from a center of a gate stack 708 of the first transistor 702 to a center of a gate stack 710 of the second transistor 704. For example, in the illustrated embodiment, the poly spacing is defined as the distance "Y" 712.

In an embodiment, a size of at least one of a source 112 of the first transistor 702 or a size of a drain 114 of the first transistor 702 is a function of the poly spacing between the first transistor 702 and the second transistor 704. For example, in an embodiment, the source 112 has a height-to-length ratio (e.g., where the height and length of a source is defined in FIG. 6) exceeding at least 1.5 when the poly spacing between the first transistor 702 and the second transistor 704 is less than about 75 nm and has a height-to-length ration exceeding at least 1.6 when the poly spacing between the first transistor 702 and the second transistor 704 is less than about 60 nm. In another embodiment, the drain 114 has a height-to-length ratio (e.g., where the height and length of the drain is defined in FIG. 6) exceeding at least 1.5 when the poly spacing between the first transistor 702 and the second transistor 704 is less than about 75 nm and has a height-to-length ration exceeding at least 1.6 when the poly spacing between the first transistor 702 and the second transistor 704 is less than about 60 nm. It is to be appreciated that in other embodiments, the source of the first transistor 702 has a ratio that is equal to or less than 1.5 when the poly spacing between the first transistor 702 and the second transistor 704 is less than about 75 nm or equal to or less than 1.6 when the poly spacing between the first transistor 702 and the second transistor 704 is less than about 60 nm. It is also to be appreciated that in other embodiments, the drain of the first transistor 702 has a ratio that is equal to or less than 1.5 when the poly spacing between the first transistor 702 and the second transistor 704 is less than about 75 nm or equal to or less than 1.6 when the poly spacing between the first transistor 702 and the second transistor 704 is less than about 60 nm.

Figure 8:
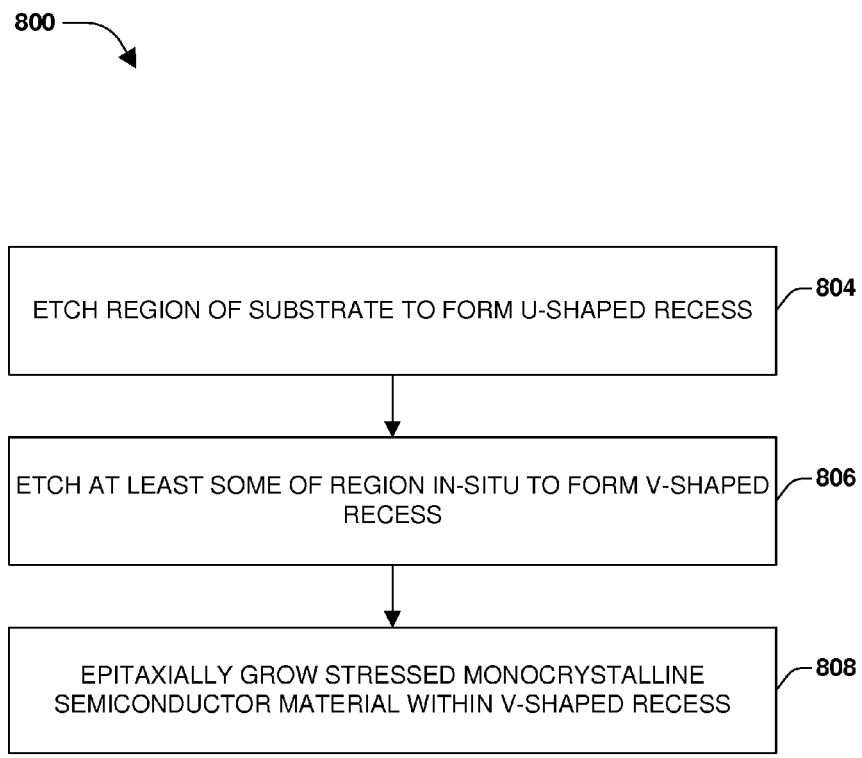
FIG. 8 illustrates is a flow chart diagram of an example method for forming a semiconductor device according to some embodiments.

FIG. 8 illustrates an example flow diagram providing an example method 800 for forming a semiconductor device (e.g., 100 in FIG. 1) comprising at least one v-shaped recess wherein stressed monocrystalline semiconductor material is epitaxially grown to form at least one of a source or a drain of the semiconductor device.

In the example method 800, a substrate to be etched is received. In an embodiment, the substrate that is received is a substrate having a configuration similar to the configuration shown in FIG. 2, where a gate and sidewall spacers have previously been formed on a first substrate surface of the substrate. Thus, in an embodiment, the substrate that is received has already undergone at least some processes.

At 804 in the example method 800, a region of the substrate is etched to form a u-shaped recess. In an embodiment, the region of the substrate that is etched is a region spatially adjacent to a region of the substrate that underlays a sidewall spacer. That is, for example, the region of the substrate that is etched at 804 is a region wherein it is desirable to form at least one of the source or the drain of a transistor or other semiconductor device.

In an embodiment, both a drain and a source are formed according to the example method 800. Accordingly, two u-shaped recesses are formed at 804. In such an embodiment, a first u-shaped recess is formed in a region of the substrate spatially proximate a first sidewall spacer and a second u-shaped recess is formed in a region of the substrate spatially proximate a second sidewall spacer. Typically, the first u-shaped recess is formed on a diametrically opposite side of the gate relative to the second u-shaped recess.

In an embodiment, the u-shaped recess(es) is etched via wet etching. In another embodiment, the u-shaped recess(es) is etched via dry etching. For example, in an embodiment, the u-shaped recess(es) is etched via a dry etching technique using an etching component that is at least partially isotropic in character. In yet another embodiment, the u-shaped recess(es) is etched via reactive-ion etching or other suitable etching techniques, for example.

At 806 in the example method 800, at least some of the region where at least one u-shaped recess was formed is etched in-situ to form a v-shaped recess. Typically, the region of the substrate that is etched to form the v-shaped recess is a region spatially proximate the u-shaped recess(es) (e.g., and encompasses the region occupied by the u-shaped recess). For example, in an embodiment, one or more sidewalls or surfaces that define the u-shaped recess(es) are etched to form the v-shaped recess. That is, for example, a lattice structure of the substrate neighboring and/or defining the u-shaped recess is etched to enlarge the u-shaped recess. Accordingly, in an embodiment, a volume of the v-shaped recess is greater than a volume of a u-shaped recess that is being replaced by the v-shaped recess via the etching at 806 in the example method 800.

As described with respect to FIGS. 3-4, a cross-sectional shape of the v-shaped recess typically varies from a cross-sectional shape of the u-shaped recess. For example, in an embodiment, the u-shaped recess is defined by a substantially continuous sidewall of the substrate (e.g., a sidewall substantially void of corners). Conversely, a v-shaped recess is typically defined by a plurality of sidewalls, where at least a first sidewall of the plurality joins a second sidewall of the plurality at a hard edge (e.g., a defined corner). Moreover, at least one sidewall of the plurality typically is angled at an angle other than normal relative to the first substrate surface upon which the gate is formed.

The v-shaped recess is etched into the substrate in-situ. In an embodiment, etching the substrate to form the v-shaped recess comprises etching the substrate 102 (or a region of the substrate spatially proximate the u-shaped recess) via a chemical vapor deposition (CVD) configured to apply an etching gas to at least a portion of the substrate where the etching is to occur. For example, a CVD tool applies the etching gas to a portion of the substrate spatially proximate the u-shaped recess. In an example, the etching gas comprises hydrogen chloride (HCl) or other suitable gaseous compositions. The etching gas is configured to interact with the lattice structure of the substrate to break down at least a portion of the lattice structure and form the v-shaped recess.

In some embodiments, the etching gas is heated to a desired temperature that causes the etching gas to interact with a lattice structure of the substrate to form the v-shaped recess. By one of example, in an embodiment, the etching gas is heated to a temperature of between about 400 degrees Celsius to about 1000 degrees Celsius. In another embodiment, the etching gas comprises hydrogen chloride and is heated to a temperature of about 780 degrees Celsius or other suitable temperature.

In an embodiment, native oxide is removed from the substrate prior to etching the substrate to form the v-shaped recess. By way of example, in an embodiment, native oxide that has developed on the substrate (and in the u-shaped recess formed at 804) is removed in-situ prior to etching the v-shaped recess. In some embodiments, the native oxide is removed via a low-pressure oxidation process or other suitable oxide removal process, for example.

In an embodiment where the substrate comprises multiple u-shaped recessed, fewer than all of the u-shaped recesses are formed into v-shaped recesses via the etching at 806. For example, in an embodiment merely one of two u-shaped recesses formed in a substrate is transformed into a v-shaped recess via the etching at 806. The other u-shaped recess remain u-shaped, for example. In another embodiment, both of the two u-shaped recesses are transformed into v-shaped recesses via the etching at 806.

At 808 in the example method 800, stressed monocrystalline semiconductor material is epitaxially grown within the v-shaped recess. That is, for example, a region of stressed monocrystalline semiconductor material is epitaxially grown from the exposed interior surface(s) of the v-shaped recess. In some embodiments, the stressed monocrystalline semiconductor material comprises an alloy of silicon combined with another semiconductor material. For example, in an embodiment, the stressed monocrystalline semiconductor material is silicon germanium. In some embodiments, dopants are added to the stressed monocrystalline semiconductor material to affect electrical properties of a source or a drain formed by the stressed monocrystalline semiconductor material. A degree of doping (if any) is a function of the desired application for the PFET 100, for example.

It is to be appreciated that the monocrystalline semiconductor material is referred to as stressed due the compression of the monocrystalline semiconductor material by the v-shaped recess in which the monocrystalline semiconductor material is grown. That is, for example, the v-shaped recess causes the monocrystalline semiconductor material to be stressed or compressed, which increases a mobility of carries within a transistor (e.g., improving performance and/or reducing power consumption of the transistor.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A transistor, comprising:
   a source/drain region having a height-to-length ratio exceeding at least 1.5 when a poly spacing between the transistor and a second transistor is less than about 75 nm and having a height-to-length ratio exceeding at least 1.6 when the poly spacing between the transistor and the second transistor is less than about 60 nm.

2. The transistor of claim 1, the transistor comprising a p-channel field effect transistor.

3. The transistor of claim 2, the second transistor comprising a n-channel field effect transistor.

4. The transistor of claim 1, the source/drain region comprising a first type of dopant and a source/drain region of the second transistor comprising a second type of dopant.

5. The transistor of claim 4, the second type of dopant different than the first type of dopant.

6. The transistor of claim 4, the first type of dopant being a p-type dopant and the second type of dopant being an n-type dopant.

7. The transistor of claim 1, the source/drain region comprising a stressed monocrystalline semiconductor material.

8. The transistor of claim 7, the stressed monocrystalline semiconductor material comprising stressed silicon germanium.

9. The transistor of claim 1, the source/drain region disposed within a v-shaped recess of a substrate.

10. The transistor of claim 9, the v-shaped recess being defined by a first sidewall of the substrate, the first sidewall orientated at an angle other than normal relative to a first substrate surface upon which a gate stack of the transistor is formed.

11. The transistor of claim 1, comprising a capping layer disposed over the source/drain region.

12. The transistor of claim 11, the capping layer having a first concentration of silicon and the source/drain region having a second concentration of silicon, the first concentration greater than the second concentration.

13. A transistor, comprising:
 a source/drain region having a height-to-length ratio exceeding at least 1.6 when the poly spacing between the transistor and a second transistor is less than about 60 nm.

14. The transistor of claim 13, the source/drain region comprising a first type of dopant and a source/drain region of the second transistor comprising a second type of dopant.

15. The transistor of claim 14, the second type of dopant different than the first type of dopant.

16. The transistor of claim 14, the first type of dopant being a p-type dopant and the second type of dopant being an n-type dopant.

17. The transistor of claim 13, the source/drain region comprising a stressed monocrystalline semiconductor material.

18. The transistor of claim 17, the stressed monocrystalline semiconductor material comprising stressed silicon germanium.

19. The transistor of claim 13, the source/drain region disposed within a v-shaped recess of a substrate, the v-shaped recess being defined by a first sidewall of the substrate, the first sidewall orientated at an angle other than normal relative to a first substrate surface upon which a gate stack of the transistor is formed.

20. A semiconductor device, comprising:
 a first transistor; and
 a second transistor spaced apart from the first transistor by a poly spacing and comprising:
  a source/drain region, wherein a height-to-length ratio of the source/drain region is a function of the poly spacing, the height-to-length ratio exceeding at least 1.5 when the poly spacing between the first transistor and the second transistor is less than about 75 nm and exceeding at least 1.6 when the poly spacing between the first transistor and the second transistor is less than about 60 nm.

* * * * *